US009722196B2

(12) United States Patent
Zakhidov et al.

(10) Patent No.: US 9,722,196 B2
(45) Date of Patent: *Aug. 1, 2017

(54) METHOD FOR PRODUCING AN ORGANIC FIELD EFFECT TRANSISTOR AND AN ORGANIC FIELD EFFECT TRANSISTOR

(71) Applicant: Novaled GmbH, Dresden (DE)

(72) Inventors: Alexander Zakhidov, Dresden (DE); Bjoern Luessem, Dresden (DE); Karl Leo, Dresden (DE); Hans Kleemann, Dresden (DE)

(73) Assignee: Novaled GmbH, Dresden (DE)

( * ) Notice: Subject to any disclaimer, the term of this patent is extended or adjusted under 35 U.S.C. 154(b) by 3 days.

This patent is subject to a terminal disclaimer.

(21) Appl. No.: 14/390,691

(22) PCT Filed: Mar. 28, 2013

(86) PCT No.: PCT/EP2013/056738
§ 371 (c)(1),
(2) Date: Oct. 3, 2014

(87) PCT Pub. No.: WO2013/149947
PCT Pub. Date: Oct. 10, 2013

(65) Prior Publication Data
US 2015/0090976 A1  Apr. 2, 2015

(30) Foreign Application Priority Data
Apr. 5, 2012  (EP) .................................... 12163473

(51) Int. Cl.
*H01L 35/24*  (2006.01)
*H01L 51/05*  (2006.01)
(Continued)

(52) U.S. Cl.
CPC ............ *H01L 51/057* (2013.01); *B82Y 10/00* (2013.01); *H01L 51/0002* (2013.01);
(Continued)

(58) Field of Classification Search
CPC ...................... H01L 51/0038; H01L 51/0545
(Continued)

(56) References Cited

U.S. PATENT DOCUMENTS

| | | | |
|---|---|---|---|
| 2005/0040390 | A1 | 2/2005 | Pfeiffer et al. |
| 2009/0179189 | A1 | 7/2009 | Werner et al. |
| 2009/0315043 | A1 | 12/2009 | Nakamura et al. |

FOREIGN PATENT DOCUMENTS

| | | |
|---|---|---|
| WO | 2010/113163 A1 | 10/2010 |
| WO | 2011/139774 A2 | 11/2011 |

OTHER PUBLICATIONS

Hans et al., U.S. Appl. No. 14/783,229, Method for Producing organic field effect transistor, filed Oct. 8, 2015.*

(Continued)

*Primary Examiner* — Samuel Gebremariam
(74) *Attorney, Agent, or Firm* — Eversheds Sutherland (US) LLP

(57) ABSTRACT

Methods for producing organic field effect transistors, organic field effect transistors, and electronic switching devices are provided. The methods may include providing a gate electrode and a gate insulator assigned to the gate electrode for electrical insulation on a substrate, depositing a first organic semiconducting layer on the gate insulator, generating a first electrode and an electrode insulator assigned to the first electrode for electrical insulation on the first organic semiconducting layer, depositing a second organic semiconducting layer on the first organic semicon- (Continued)

ducting layer and the electrode insulator, and generating a second electrode on the second organic semiconducting layer.

10 Claims, 6 Drawing Sheets

(51) Int. Cl.
    *H01L 51/10* (2006.01)
    *B82Y 10/00* (2011.01)
    *H01L 51/00* (2006.01)
(52) U.S. Cl.
    CPC ........ *H01L 51/0018* (2013.01); *H01L 51/102* (2013.01); *H01L 51/105* (2013.01); *H01L 51/0016* (2013.01); *H01L 51/0046* (2013.01); *H01L 51/0055* (2013.01)
(58) Field of Classification Search
    USPC .............................. 257/40, E25.008, E33.001
    See application file for complete search history.

(56) References Cited

OTHER PUBLICATIONS

Blochwitz et al., "Low Voltage Organic Light Emitting Diodes Featuring Doped Phthalocyanine as Hole Transport Material," Applied Physics Letters, 1998, 73(6):729-731.
D'Andrade et al., "Operational Stability of Electrophosphorescent Devices Containing p and n Doped Transport Layers," Applied Physics Letters, 2003, 83(19):3858-3860.
Gao et al., "Controlled p-doping of Zinc Phthalocyanine by Coevaporation with Tetrafluorotetracyanoquinodimethane: A Direct and Inverse Photoemission Study," Applied Physics Letters, 2001, 79(24):4040-4042.
Nakamura, et al., "Metal-Insulator-Semiconductor-Type Organic Light-Emitting Transistor on Plastic Substrate," Applied Physics Letters, 2006, 89:103525-1-103525-3.
Walzer et al., "Highly Efficient Organic Devices Based on Electrically Doped Transport Layers," Chem. Rev., 2007, 107:1233-1271.
PCT International Search Report for PCT Application No. PCT/EP2013/056738 mailed May 14, 2013 (2 pages).

* cited by examiner

METHOD FOR PRODUCING AN ORGANIC FIELD EFFECT TRANSISTOR AND AN ORGANIC FIELD EFFECT TRANSISTOR

CROSS-REFERENCE TO RELATED APPLICATIONS

This is a submission pursuant to 35 U.S.C. 154(d)(4) to enter the national stage under 35 U.S.C. 371 for PCT/EP20131056738, filed 28 Mar. 2013. Priority is claimed under 35 U.S.C. 119(a) and 35 U.S.C. 365(b) to European Application No. 12 163 473.7, filed 5 Apr. 2012. The subject matters of PCT/EP2013/056738 and European Application No. 12 163 473.7 are incorporated herein by reference.

The invention relates to a method for producing an organic field effect transistor and an organic field effect transistor.

BACKGROUND OF THE INVENTION

For a realization of flexible and transparent electronic components based on organic semiconducting elements it is necessary to develop capable and robust organic transistors. A promising approach is provided by vertical organic field effect transistors (VOFETs).

A VOFET (as field effect transistors in general) is formed with three electrodes, namely a gate electrode, a source electrode and a drain electrode. In a VOFET, the source electrode and the drain electrode are connected with each other by an organic semiconductor. The gate electrode is separated from the source electrode and the drain electrode by an insulator. The elements of the VOFET are formed as a stack on a substrate, wherein the stack has one of the following sequences of layers: substrate/gate electrode/insulator/source electrode/drain electrode or substrate/drain electrode/source electrode/insulator/gate electrode. The organic semiconductor is always arranged between the source electrode and the drain electrode. Additionally, it can be arranged between the insulator and the source electrode. Two methods are known for producing a VOFET: self-organization of the materials and technical structuring, for example with a shadow mask.

The document WO 2010/113163 A1 discloses a vertical organic field effect transistor and a method for producing the same. The transistor comprises a patterned electrode structure which is enclosed between a dielectric layer and an active element. The active element is either an organic semiconductor or an amorphous semiconductor. The electrode structure is patterned by using a block copolymer material as a patterning mask. Hereby, the thickness of the patterned layer and lateral feature size can be selected.

A method for forming an organic device having a patterned conductive layer is disclosed in document WO 2011/139774. The method comprises the steps of depositing an organic layer on a substrate and coating the organic layer with a photoresist solution to form a photo-patternable layer. The photoresist solution includes a fluorinated photoresist material and a fluorinated solvent. Selected portions of the photo-patternable layer are radiated to form a pattern. A conductive layer is coated over the organic layer. A portion of the conductive layer is removed to form a patterned conductive layer.

K. Nakamura et al., Applied Physics Letters Vol. 89, page 103525 (2006) discloses an organic light emitting transistor. A gate electrode is arranged on a substrate and covered by a gate insulating layer. A semiconducting layer is coated on the gate insulating layer. A source electrode, an insulating layer, and a hole transporting layer are arranged on the semiconducting layer. Further, the transistor comprises an emitting layer and a drain electrode.

Document US 2009/0315043 A1 discloses an organic light-emitting transistor having a source electrode layer, a drain electrode layer facing the source electrode layer, and organic light-emitting layer formed between the source electrode layer and the drain electrode layer.

There is a need to provide a transistor design which allows high current densities in the device and which can be produced in an easy and controllable manner.

SUMMARY OF THE INVENTION

It is an object to provide a method for producing an organic field effect transistor and an organic field effect transistor, wherein the organic field effect transistor has a high current density.

This object is solved by the method according to the independent claim 1 and the organic field effect transistor according to the independent claim 6. Advantageous embodiments of the invention are the subject of dependent claims.

According to one aspect, a method for producing an organic field effect transistor is provided that comprises steps of providing a gate electrode and a gate insulator assigned to the gate electrode for electrical insulation on a substrate, depositing a first organic semiconducting layer on the gate insulator, generating a first electrode and an electrode insulator assigned to the first electrode for electrical insulation on the first organic semiconducting layer, depositing a second organic semiconducting layer on the first organic semiconducting layer and the electrode insulator, and generating a second electrode on the second organic semiconducting layer, wherein at least one of the steps of generating the first electrode and the electrode insulator on the first organic semiconducting layer and the step of generating the second electrode on the second organic semiconducting layer comprises a step of photo-lithographic structuring on the first and the second organic semiconducting layer, respectively.

According to another aspect, an organic field effect transistor is provided, comprising a first electrode and a second electrode, the electrodes providing a source electrode and a drain electrode, a gate electrode, a gate insulator provided between the gate electrode and the first electrode, an electrode insulator provided between the first and the second electrode, a first organic semiconducting layer provided between the gate insulator and the first electrode, and a second organic semiconducting layer provided between the first organic semiconducting layer and the second electrode, wherein the first and second organic semiconducting layers are configured to transport charge carriers of the same type, namely holes and electrons.

DETAILED DESCRIPTION OF THE INVENTION

The disclosure refers to a vertical transistor design. The first and second electrode each provides a contact for applying a voltage to the transistor. The gate electrode provides a contact for controlling the state of the transistor. By the electrode insulator a parallel resistance of the transistor is reduced and the ratio between the current in an ON-state and the current in an OFF-state is increased.

It is known to produce VOFETs using shadow masking. These VOFETs have a small specific edge length. With photo-lithographic structuring the edge length can be maximized while using a technical well controllable procedure. The present invention provides a high performance device without requiring sophisticated lithography equipment. Common equipment with resolution and alignment registry of about 1 μm is more than sufficient to produce the transistor.

In a hole transport layer (HTL) the mobility of holes is larger than the mobility of electrons. In an electron transport layer (ETL) the mobility of electrons is larger than the mobility of holes.

The first and second organic semiconducting layers are generated in separated steps. At least one of the first and second organic semiconducting layers may be made completely of the matrix material. There is a junction at the interface of one of the first or second electrode to the organic semiconducting material, namely a Schottky barrier. The junction depends on the polarity of the electrode (acting as source electrode or drain electrode) but not on the position of the electrode in the transistor. The Schottky barrier is modulated by the field from the gate insulator. An injection barrier only forms if the material of the adjacent organic semiconducting layer is not doped, and free of an injection layer. The path between the first electrode and the second electrode is mainly for transport only in this case.

Alternatively, at least one of the first or second organic semiconducting layer is doped which leads to an asymmetric transistor. A doped layer comprises a matrix material and at least one dopant. The doped layer may be made of the matrix material and one dopant, preferentially of more than 90% (mol) of the matrix material, even more preferable of more than 95 mol %. If one or both of the organic semiconducting layers is doped, the first and second organic semiconducting layers preferentially comprise matrix materials configured to transport the same type of charge carriers. It is even more preferred that the organic matrix material of both layers is the same material.

Preferentially, all organic semiconducting materials have singlet excitation energies equal or smaller than 2 eV, preferably smaller than 1.85 eV, and/or the singlet transition is forbidden. The singlet excitation energy is calculated from the photon energy of the wavelength of the absorption peak (maximum of the singlet peak), which implies that the emission is smaller than 1.83 eV plus the binding energy, which is typically in the infrared. Thus, the materials do not emit visible light.

In a preferred embodiment of the method, the first and second organic semiconducting layers comprise the same organic matrix material. At least one of the first and second organic semiconducting layers may be made of the organic matrix material.

Alternatively or in addition, in an embodiment of the method, the first electrode is generated with first sub-electrode portions and the second electrode is generated with second sub-electrode portions, the plurality of sub-electrode portions being arranged in separated groups of overlapping sub-electrode portions, wherein each of the separated groups of overlapping sub-electrode portions is generated with at least one first sub-electrode portion overlapping with at least one second sub-electrode portion. The sub-electrode portions of both electrodes have a correspondence; either a one-to-one correspondence if the overlap area is larger than the non-overlapping area, or a one-to-one or a one-to-two neighboring (where the end can be even or odd) if the overlap area is smaller than the non-overlapping area. In the first case, the width of the sub-electrode of the second electrode is preferentially larger than the width of sub-electrode of the sub-electrode of the first electrode.

Preferentially, the sub-electrodes portions of both electrodes are arranged parallel to each other. Hereby, the optimum of lowest capacitance while keeping the series resistance low is provided.

In a preferred embodiment, the step of generating the first electrode and the electrode insulator on the first organic semiconducting layer comprises steps of depositing a first photoresist layer on the first organic semiconducting layer, defining an electrode area for the first electrode by patterning the first photoresist layer, thereby providing a first photoresist pattern, depositing a first conductive layer on the first photoresist pattern, depositing an insulating layer on the first conductive layer, and removing the first photoresist pattern in a lift-off process, thereby generating the first electrode and the electrode insulator.

In still a further embodiment, the step of generating the second electrode on the second organic semiconducting layer comprises steps of depositing a second photoresist layer on the first organic semiconducting layer and on the electrode insulator, defining an electrode area for the second electrode by patterning the second photoresist layer, thereby providing a second photoresist pattern, depositing a second unpatterned organic semiconducting layer on the second photoresist pattern, depositing a second conductive layer on the second unpatterned organic semiconducting layer, and removing the second photoresist pattern in a lift-off process, thereby generating the second organic semiconducting layer and the second electrode. Alternatively, the deposition of the second electrode can be made after removing the patterned second photoresist layer.

For generating the first electrode and/or the second electrode patterning may involve curing a portion and removing an uncured portion. The first photoresist layer and/or the second photoresist layer can be formed as a double layer. The steps involving deposition, patterning and removing of the first and/or second photoresist layer are done under normal atmosphere. An inert gas atmosphere is not required. The first and/or second photoresist layer may be removed by an additional step of plasma etching.

The first electrode may be provided with first sub-electrode portions and the second electrode is provided with second sub-electrode portions, the plurality of sub-electrode portions being arranged in separated groups of overlapping sub-electrode portions, wherein each of the separated groups of overlapping sub-electrode portions comprises at least one first sub-electrode portion overlapping with at least one second sub-electrode portion. The object of the invention may be solved by this embodiment, even if the first and second semiconducting layers do not comprise the same organic matrix material. If this embodiment is implemented it is not necessary that the first and second organic semiconducting material comprise the same organic matrix material. Each of the at least one first sub-electrode portion and the at least one second sub-electrode portion is separated from a respective adjacent sub-electrode portion. Further, the at least one first sub-electrode portion and the at least one second sub-electrode portion may have different widths.

A current path formed between the first and second electrodes via the first and second organic semiconducting layers may be unipolar. Thus, the current through the layers may be provided by only one type of charge carriers, namely electrons or holes.

The first and second organic semiconducting layers may comprise the same organic matrix material.

The first and second organic semiconducting layers may be made of a small molecule material.

The first and second organic semiconducting layers may be in direct contact to each other.

The second organic semiconducting layer may be provided between the electrode insulator and the second electrode.

The second electrode and/or at least one of the gate electrode and the first electrode may be opaque for light. This ensures that ambient light does not affect the performance of the transistor.

At least one electrode selected from the following group may be made of a metal material: the first electrode, the second electrode, and the gate electrode. The metal material may be gold or aluminum. Electrodes made of a metal material have a low resistance while a high power with a high frequency may be applied.

The transistor may comprise a doping material layer made of an electrical doping material, the doping material layer being provided between the first electrode and the first organic semiconducting layer. Alternatively or in addition, a further doping material layer made of an electrical doping material is provided between the second electrode and the second organic semiconducting layer.

VOFETs, in general, have an asymmetric response for positive and negative VSD caused by the different electrical field from the gate electrode to the source and drain electrodes, due to the different distances of the source and drain electrodes to the gate insulator. It was found that by using a thin layer comprising a dopant material between one of the source and drain electrodes and the adjacent organic semiconducting layer, it is possible to control the asymmetry. Preferably, the thin layer comprising a dopant material has a thickness of less than 5 nm. It can be a layer consisting of a dopant material, where the thickness is preferably less than 2.5 nm. It can also be a layer comprising an organic semiconducting material and a dopant material, which dopant material exist in a ratio of less than 5 mol % in the layer, preferably less than 2 mol %.

The dopant material is preferably an electrical dopant. Electrical dopants are classified in p-dopants and n-dopants. Electrical doping is well known in the field, exemplary literature references are Gao et al, Appl. Phys. Lett. V. 79, p. 4040 (2001), Blochwitz et al, Appl. Phys. Lett. V. 73, p. 729 (1998), D'Andrade et al. App. Phys. Let. V. 83, p. 3858 (2003), Walzer et al. Chem. Rev. V. 107, p. 1233 (2007), US2005040390A1, US2009179189A. Exemplary p-dopants are: tetrafluoro-tetracyanoquinonedimethane (F4TCNQ); 2,2'-(perfluoronaphthalene-2,6-diylidene)dimalononitrile; 2,2',2''-(cyclopropane-1,2,3-triylidene)tris(2-(p-cyanotetrafluorophenyl)acetonitrile). Preferred compounds are organic molecules containing cyano groups. Exemplary n-dopants are: acridine orange base (AOB); tetrakis(1,3,4,6,7,8-hexahydro-2H-pyrimido[1,2-a]pyrimidinato)ditungsten (II) (W(hpp)4); 3,6-bis-(dimethylamino)-acridine; bis(ethylenedithio)tetrathiafulvalene (BEDT-TTF).

An electronic switching device comprising an organic field effect transistor may be provided.

The first electrode, the second electrode, and the electrode insulator may be provided not permeable. The first and second electrode as well as the electrode insulator shall preferably be thick enough to form closed layers. Preferentially, first and second electrode as well as the electrode insulator are not interrupted or perforated or randomly interrupted, but rather lithographically patterned. Also, the electrode insulator does not allow any substantial tunneling of charge carriers through it under normal operating conditions.

Several advantages are provided, for instance the process allows for a reduction of overlap capacitances. Injection can be easily improved. Higher current densities are possible even at higher frequencies. In some embodiments, the high current can be further increased in asymmetrical devices by doping one of the contacts. The two photoresist layers comprising fluorinated photoresist and/or conventional (non-fluorinated) photoresist allows the precise and robust photolithographic patterning of completely different types of organic semiconducting materials without considerable affecting the organic semiconducting material. It enables the fabrication of complementary circuits (using n- and p-channel transistors). Also transistors can easily be made with gain of 10 times, 20 times or higher than conventional planar field effect transistors having high on/off ratio of more than 105.

Preferred p-type semiconductors for the first and the second semiconducting layer are: pentacene, dinaphthothienothiophene (DNTT), further DNTF derivatives such as C10-DNTT (in general Cx-DNTT), Metal-Phthalocyanines (ZnPc, CuPc), perylenes such as Diindenoperylenes (DIP), Tetrapropyl-tetraphenyl-diindenoperylene (P4-PH4-DIP). Preferred n-type semiconductors for the first and the second semiconducting layer are: C60, C70, ZnPc, CuPc, F16CuPc, F4CuPc, Diindenoperylenes (DIP).

In another embodiment of the invention, a circuit is provided comprising:
  at least a n-type VOFET comprising a n-type material and
  at least a p-type VOFET comprising a p-type material.

Preferentially, the first and the second organic semiconducting layers consist each of one kind of semiconducting material. Alternatively or in addition, layers forming the electrodes can be shared between the n-type and p-type VOFET.

For materials which growth layers with high roughness (e.g. the roughness is of the order of the layer thickness itself), such as pentacene, it is preferred to keep the layers thin, preferably thinner than 60 nm, more preferably thinner than 40 nm. That ensures a good processability.

According to one aspect, a dual layer photoresist and a method of using a dual layer photoresist for patterning organic semiconducting materials may be provided. The dual layer photoresist is applied over a layer of an organic semiconducting material. The dual layer photoresist consists of a layer of fluorine based photoresist, which contacts the organic semiconducting material to be patterned, and a non-fluorine based photoresist. With that combination, it is possible to pattern the most different kinds of organic semiconducting materials; non limiting examples are pentacene, C60, ZnPc, etc.

The photolitographic patterning procedure may comprise at least some of the following steps: depositing the fluorin based photoresist over the semiconducting layer; depositing the (non-fluorine based) photoresist over the fluorin based photoresist layer; illuminating (exposing) the fluorin and the non-fluorin based photoresist layer; developing the non-fluorine based photoresist patter; developing the fluorine based photoresist pattern; depositing an additional organic or inorganic layer on top of the then patterned photoresist layer; and patterning the additional organic or inorganic layer by lift-off of the fluorin based and non-fluorine based photoresist. Some or all steps may be performed at atmospheric pressure.

BRIEF DESCRIPTION OF THE DRAWINGS

In the following embodiments will be described in further detail, by way of example, with reference to figures. In the figures show:

FIG. 1 shows a schematic representation of a vertical organic field effect transistor which comprises several layers. The transistor comprises a gate electrode 1 on which a gate insulator 2 is deposited. A first organic semiconducting layer 3 is arranged on the gate insulator 2. Further, a first electrode 4, an electrode insulator 5 and a second organic semiconducting layer 6 are provided. On top of the transistor, a second electrode 7 is arranged. The transistor may be arranged on a substrate (not shown).

Figure 1:
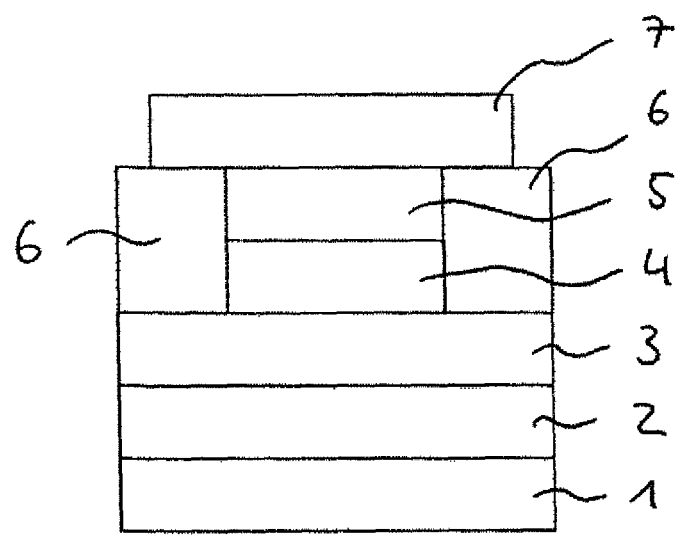
FIG. 1 a schematic representation of a vertical organic field effect transistor, FIG. 2 a schematic representation of another vertical organic field effect transistor, FIG. 3 a schematic representation of an electrode configuration, FIG. 4 the ISD×V curve of a p-type VOFET with pentacene as organic material, for different VGS bias, FIG. 5 the source drain current of the same transistor as in FIG. 4, as a function of VGS represented in Ampere (right) and as (10-6)1/2 A (left), FIG. 6 the ISD×V curve of a p-type VOFET with C60 as organic material, for different VGS bias, FIG. 7 the source drain current of the same transistor as in FIG. 6, as a function of VGS represented in Ampere (right) and as (10-6)1/2 A (left), FIG. 8 the scaling of the mobility of the charge carriers in a conventional FET with the distance between the source and drain electrodes, and FIG. 9 the scaling of the current (transconductance) of the charge carriers in a VOFET.
Figure 2:
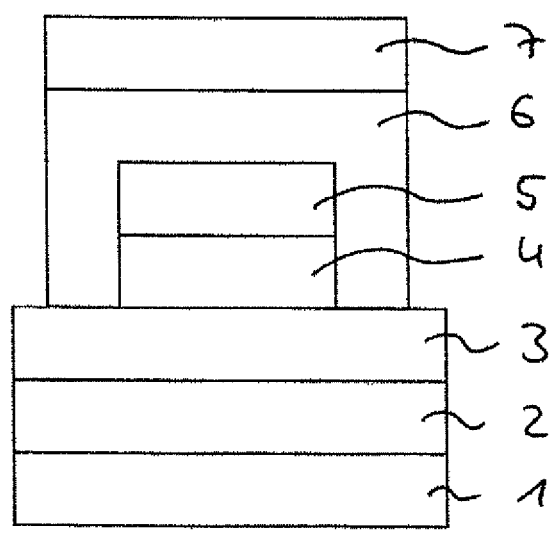
FIG. 2 shows a schematic representation of another transistor design. In this embodiment, the second electrode 7 and the electrode insulator 5 are divided by the second organic semiconducting layer 6. The second electrode 7 and the second organic semiconducting layer 6 have the same lateral dimension.
Figure 3:
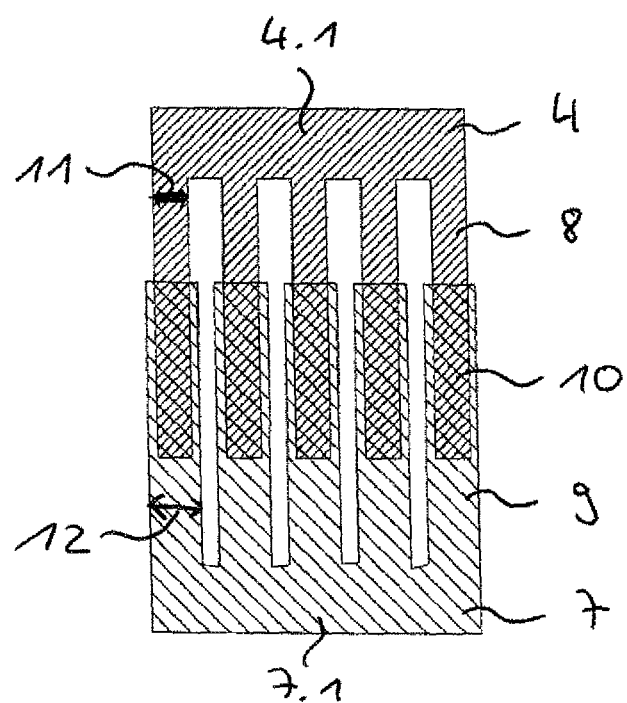
FIG. 3 shows a schematic representation of an electrode configuration. The first electrode 4 is provided with first sub-electrode portions 8 and the second electrode 7 is provided with second sub-electrode portions 9. The plurality of sub-electrode portions 8, 9 are arranged in separated groups of overlapping sub-electrode portions 10. Each of the separated groups of overlapping sub-electrode portions 10 comprises at least one first sub-electrode portion 8 overlapping with at least one second sub-electrode portion 9. The width 11 of the first sub-electrode portions 8 is optimized to be as small as possible to obtain the lowest possible capacitance between the first and second electrode 4, 7 but large enough to collect the current which is limited by the mobility of the charge carriers. A width 12 of the second sub-electrode portions 9 is larger than the width 11 and is optimized for lowest capacitance (source-drain capacitance) while large enough to not considerably limit the current. Preferentially, portions 4.1 and 7.1 do not overlap. Preferentially, the sub-electrode portions 8, 9 are parallel to the each other (intra and inter-electrodes parallelism), because that leads to the lowest series resistance and highest overlap length (active area).

Following, a method for producing a transistor is disclosed. At first, a gate electrode 1 made of silicon (serving at the same time as substrate) is provided which also serves as a substrate for following layers. Typical substrate materials are Glass, Polyethylene, other common polymers for foils, gate materials: ITO, Pedot:PSS, Al, all air stable metals, carbon nanotubes, graphene. The gate electrode 1 may be doped. The gate electrode 1 is coated with the gate insulator 2 made of aluminum oxide. The gate insulator 2 may be applied to the gate electrode 1, e.g., by a printing method, atomic layer deposition, etc. The surface of the gate insulator 2 is cleaned in several steps before the first organic semiconducting layer 3 is applied. Afterwards, a first photoresist layer is deposited on the first organic semiconducting layer 3. The first photoresist layer comprises a special lacquer for protecting the organic material of the first organic semiconducting layer 3. After illuminating and processing (patterning by removing the uncured portion) the first photoresist layer a gold layer is vapor deposited to provide the first (source) electrode 4. In a next step, the electrode insulator 5 is deposited. For example, insulation is provided by a silicon dioxide layer that is deposited on the first electrode 4 by magnetron sputtering. Non required parts of the first photoresist layer, the first electrode 4 and the electrode insulator 5 are removed in a lift-off process. A second photoresist layer is deposited, illuminated and processed for structuring the second electrode 7. The second organic semiconducting layer 6 which preferentially comprises the same matrix material as the first organic semiconducting layer 3 is deposited on the second photoresist layer. On the second organic semiconducting layer 6 the second (drain) electrode 7 is deposited. Finally, non-required parts of the second photoresist layer, the second organic semiconducting layer 6 and the second electrode 7 are removed in a lift-off process, defining layers 6 and 7. The first and second organic semiconducting layer 3, 6 may be either electron transport layers, comprising C60, for example, or hole transport layers, comprising pentacene, for example.

In one example, an n-Si wafer with a 23 nm thick Al2O3 layer is used as substrate and gate electrode and gate insulator. The wafer is cleaned with isopropanol (IPA) in a supersonic bath for 5 min and further ozone plasma etching for 10 min. The wafer is dipped in a solution of HMDS (Hexamethyldisilazane) for 30 min for enhancing adherence of the organic layer (this step is optional) with further spin rinsing IPA (1000 rpm, 30 s). 25 nm of Pentacene is deposited on the Al2O3 side by ALD from Namlab, onto which a 1 µm thick layer of Ortho 310 from Orthogonal Inc. is spin coated at 30 s, and 3000 rpm. A second coating of Ma P 1210 from micro resist (30 s, 3000 rpm) follows on top of the Ortho 310 layer, forming a double layer photo resists. Both photoresist are processed under yellow light (lithography room), at 22° C. The sample rests for 10 min under yellow light (lithography room), 22° C.

Using a mask aligner (finger grid, finger length 200 µm, lateral dimensions are 30 and 50 µm), sample is exposed (e.g. to a Mercury lamp i-line (365 nm), dose 35 mJ/cm²) for forming the source electrode for time=0.6 s and developed under yellow light (lithography room) at 22° C. in an aqueous solution of NaOH for 17 s (NaOH solution as ordered from supplier (microresist) under the acronym ma-D 331) for patterning the upper photoresist layer.

Afterwards, the sample is dipped into HFE 7300 for 3 minutes and 30 seconds with posterior rinsing in HFE7300 for 30 s (solvents from Orthogonal Inc.) for patterning the lower photoresist layer.

A 30 nm thick layer of Au is deposited as first electrode using VTE. A 100 nm thick layer of SiO2 is deposited by RF-sputtering. The patterning of the Au/SiO2 is done by Lift-Off in HFE 7300 for 12 h in a glovebox with nitrogen gas.

A second photolithographic step follows, with the spin coating of Ortho 310 at 30 s and 3000 rpm, and posterior coating of Ma-P 1210 at 30 s and 3000 rpm (Yellow light, 22° C.). The sample rests for 10 min. Again, using a mask aligner, the photoresist is exposed for 0.6 s (Mercury lamp i-line (365 nm), dose 35 mJ/cm$^2$, finger grid (finger grid, finger length 200 µm, lateral dimensions are 30 and 50 µm). The developing occurs in a solution of NaOH (NaOH as ordered from supplier under the acronym ma-D 331, yellow light (lithography room), 22° C.). The undeveloped photoresist is removed by dipping into HFE 7300 (3 min 30 s) and subsequent rinsing in HFE 7300 for 30 s (solvents from Orthogonal Inc.).

A 25 nm thick layer of Pentacene is deposited (VTE) on top, followed by a 30 nm thick layer of Au as second electrode. A lift off process, in HFE 7300 during 12 h in a glovebox with nitrogen gas (diffuse ambient light, 22° C.), patterns the pentacene and the Au layer.

Figure 4:
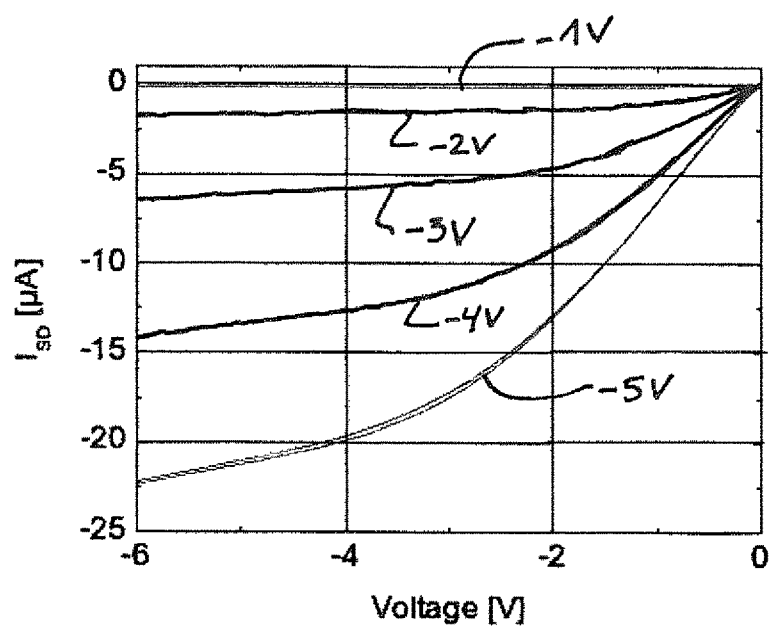
Figure 5:
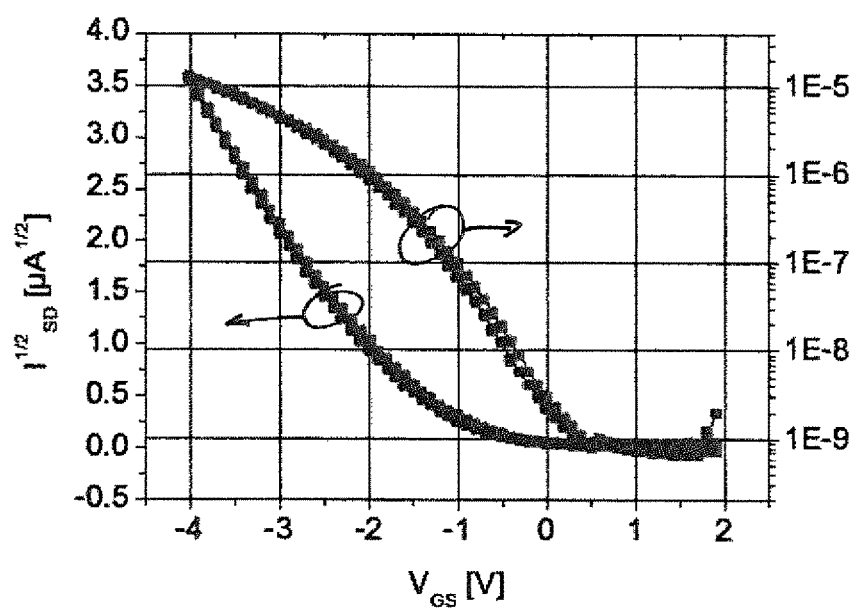

The electrical transfer curves are shown in FIGS. 4 and 5. As can be seen the obtained transistor has almost ideal performance. High charge carrier mobility of >0.3 cm2/Vs is obtained for pentacene. These results are very surprising because it would have been expected that at least the photolithographic process would have deteriorated the organic layer.

In another example, the same procedure as above was used to fabricate VOFETs of n-type with C60 as the organic semiconductor.

Figure 6:
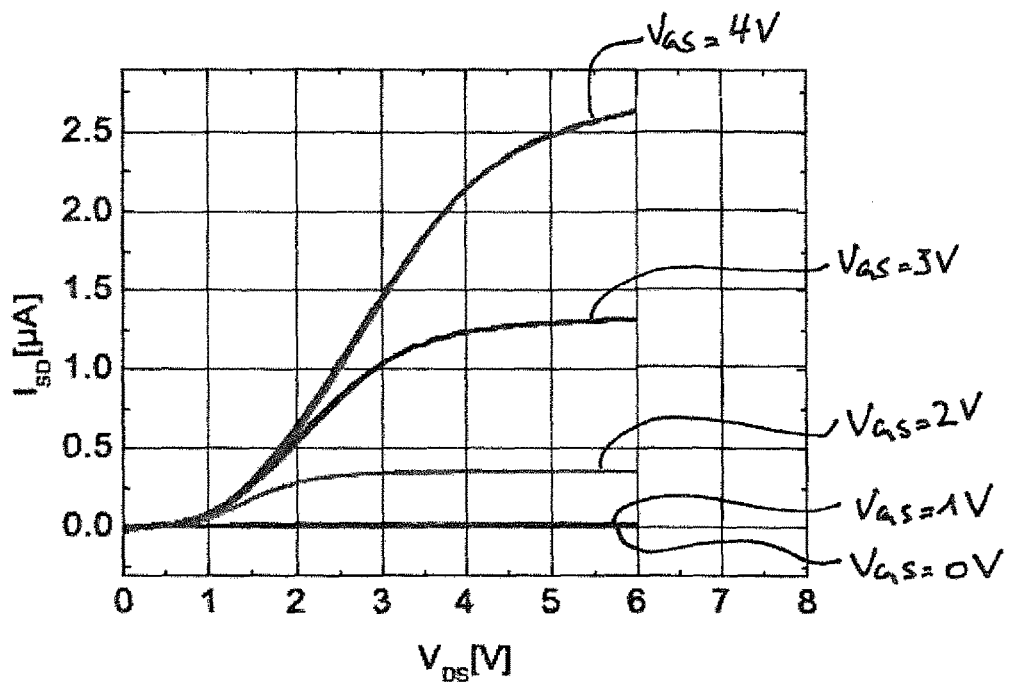
Figure 7:
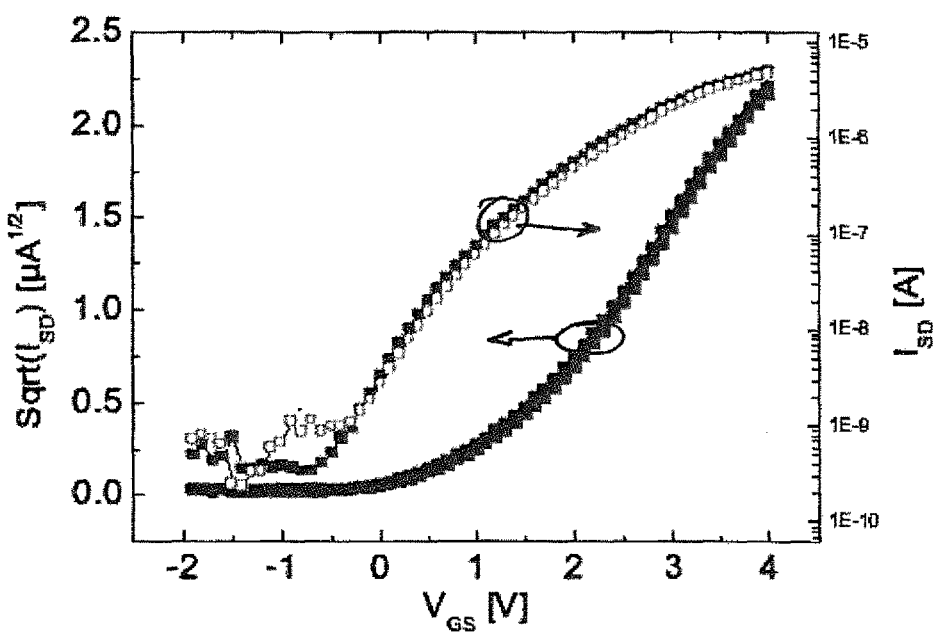
Figure 8:
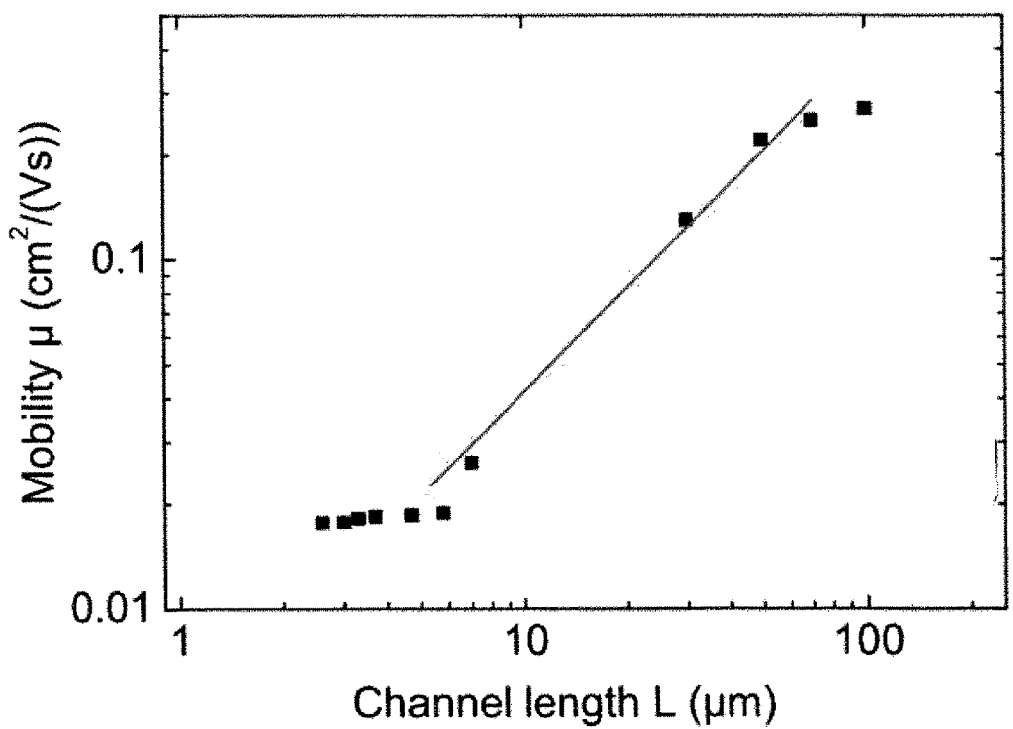
Figure 9:
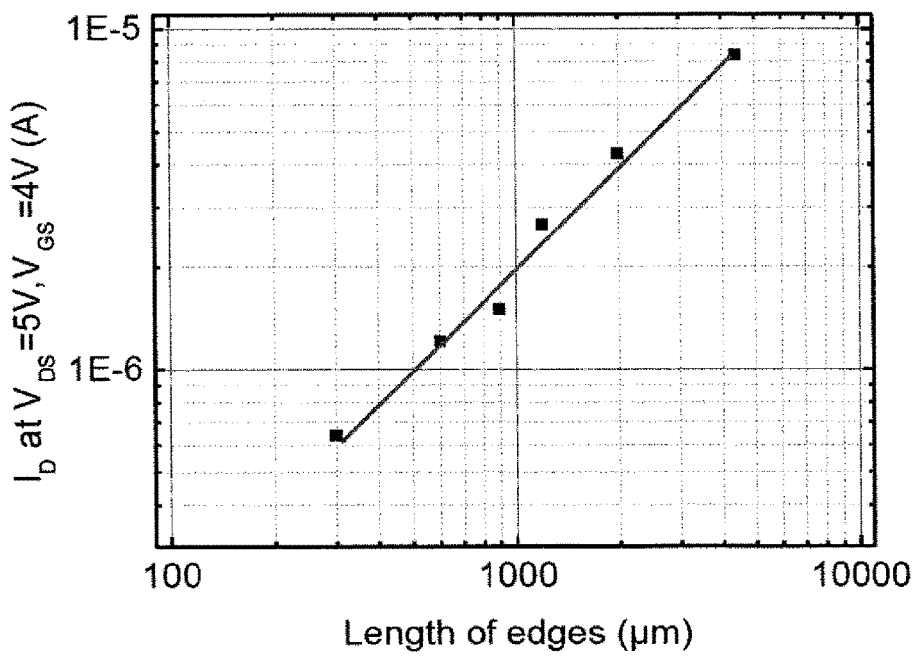

The electrical transfer curves for the n-type VOFET are shown in FIGS. 6 and 7. As can be seen the obtained transistor has almost ideal performance. High charge carrier mobility of >0.3 cm2/Vs is obtained for C60. These results are very surprising because it would have been expected that at least the photolithographic process would have deteriorated the organic layer.

The invention claimed is:

1. An organic field effect transistor, comprising:
    a first electrode and a second electrode, the first electrode and second electrode providing a source electrode and a drain electrode,
    a gate electrode,
    a gate insulator arranged between the gate electrode and the first electrode,
    an electrode insulator arranged between the first electrode and the second electrode,
    a first organic semiconducting layer arranged between the gate insulator and the first electrode, and
    a second organic semiconducting layer arranged between the first organic semiconducting layer and the second electrode,
wherein the first and second organic semiconducting layers are configured to transport charge carriers of the same type, either holes and electrons.

2. The transistor according to claim 1, wherein the first electrode comprises first sub-electrode portions and the second electrode comprises second sub-electrode portions, wherein the first and second sub-electrode portions are arranged in separated groups of overlapping sub-electrode portions, and wherein each of the separated groups of overlapping sub-electrode portions comprises at least one first sub-electrode portion overlapping with at least one second sub-electrode portion.

3. The transistor according to claim 1, wherein the first and second organic semiconducting layers comprise the same organic matrix material.

4. The transistor according to claim 1, wherein the first and second organic semiconducting layers consist of a small molecule material.

5. The transistor according to claim 1, wherein the first and second organic semiconducting layers are in direct contact with each other.

6. The transistor according to claim 1, wherein the second organic semiconducting layer is arranged between the electrode insulator and the second electrode.

7. The transistor according to claim 1, wherein the second electrode and at least one of the gate electrode and the first electrode are opaque for light.

8. The transistor according to claim 1, wherein at least one electrode selected from the group consisting of the following electrodes is made of a metal material: the first electrode, the second electrode, and the gate electrode.

9. The transistor according to claim 1, further comprising at least one of the following layers:
    a first doping material layer comprising a first electrical doping material, wherein the first doping material layer is arranged between the first electrode and the first organic semiconducting layer, and
    a second doping material layer comprising a second electrical doping material, wherein the second doping material layer is arranged between the second electrode and the second organic semiconducting layer.

10. An electronic switching device, comprising an organic field effect transistor according to claim 1.

* * * * *